(12) United States Patent
Or-Bach

(10) Patent No.: US 6,194,912 B1
(45) Date of Patent: Feb. 27, 2001

(54) INTEGRATED CIRCUIT DEVICE

(75) Inventor: Zvi Or-Bach, Reno, NV (US)

(73) Assignee: eASIC Corporation, San Jose, CA (US)

( * ) Notice: Subject to any disclaimer, the term of this patent is extended or adjusted under 35 U.S.C. 154(b) by 0 days.

(21) Appl. No.: 09/265,998

(22) Filed: Mar. 11, 1999

(51) Int. Cl.[7] .................................................. H03K 19/177
(52) U.S. Cl. .................................................. 326/38; 326/39
(58) Field of Search ........................................ 326/37–41

(56) References Cited

U.S. PATENT DOCUMENTS

| | | |
|---|---|---|
| 4,827,325 | 5/1989 | Or-bach et al. . |
| 4,866,508 * | 9/1989 | Eichelberger et al. ................. 326/39 |
| 4,924,287 | 5/1990 | Orbach ................................... 357/51 |
| 4,933,738 | 6/1990 | Orbach et al. .......................... 357/51 |
| 4,949,257 | 8/1990 | Orbach . |
| 4,960,729 | 10/1990 | Orbach et al. ........................ 437/101 |
| 5,027,027 | 6/1991 | Orbach et al. . |
| 5,036,178 | 7/1991 | Orbach . |
| 5,049,969 | 9/1991 | Orbach . |
| 5,068,063 | 11/1991 | Tremper, III ........................ 252/518 |
| 5,111,273 | 5/1992 | Orbach et al. ......................... 357/51 |
| 5,128,601 | 7/1992 | Orbach et al. . |
| 5,132,571 | 7/1992 | McCollum et al. . |
| 5,138,194 | 8/1992 | Yoeli . |
| 5,191,241 | 3/1993 | McCollum et al. . |
| 5,260,597 | 11/1993 | Orbach et al. ........................ 257/529 |
| 5,329,152 | 7/1994 | Janai et al. ........................... 257/529 |
| 5,367,392 | 11/1994 | Janai . |
| 5,512,765 | 4/1996 | Gaverick . |
| 5,526,278 | 6/1996 | Powell ................................. 364/489 |
| 5,545,904 | 8/1996 | Orbach . |
| 5,550,839 | 8/1996 | Buch et al. ......................... 371/22.1 |
| 5,565,758 | 10/1996 | Yoeli et al. ............................ 326/41 |
| 5,619,062 | 4/1997 | Janai et al. ........................... 257/529 |
| 5,679,967 | 10/1997 | Janai et al. ........................... 257/209 |
| 5,684,412 | 11/1997 | Yoeli et al. ............................ 326/39 |
| 5,687,325 * | 11/1997 | Chang ................................... 326/39 |
| 5,687,412 | 11/1997 | McIntyre ............................. 396/319 |
| 5,751,165 | 5/1998 | Yoeli et al. ............................ 326/47 |
| 5,781,031 | 7/1998 | Bertin et al. . |
| 5,818,728 | 10/1998 | Yoeli et al. .......................... 364/491 |
| 5,825,202 * | 10/1998 | Tavana et al. ......................... 326/39 |
| 5,825,203 | 10/1998 | Kusunoki et al. . |
| 5,861,641 | 1/1999 | Yoeli et al. . |
| 5,883,525 * | 3/1999 | Tavana et al. ......................... 326/39 |
| 5,903,490 | 5/1999 | Rotem . |
| 5,959,466 * | 9/1999 | McGowan ............................. 326/39 |
| 6,020,755 * | 2/2000 | Andrews et al. ...................... 326/39 |
| 6,054,872 | 4/2000 | Fudanuki et al. . |
| 6,066,960 | 5/2000 | Pedersen . |

* cited by examiner

Primary Examiner—Michael Tokar
Assistant Examiner—Don Phu Le
(74) Attorney, Agent, or Firm—Venable; Robert J. Frank; Jeffrey W. Gluck

(57) ABSTRACT

A personalizable and programmable integrated circuit device including at least first and second programmable logic cells and at least two electrical conductive paths interconnecting the programmable logic cells, at least a portion of which can be removed for personalization of the integrated circuit device.

10 Claims, 7 Drawing Sheets

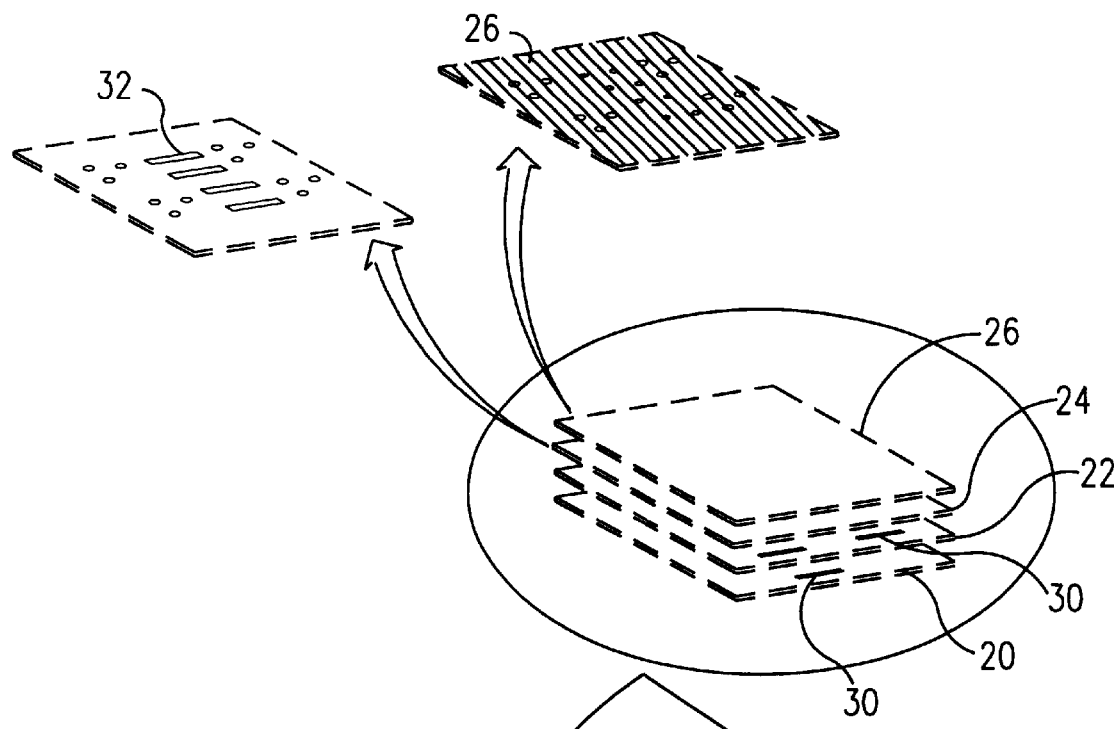
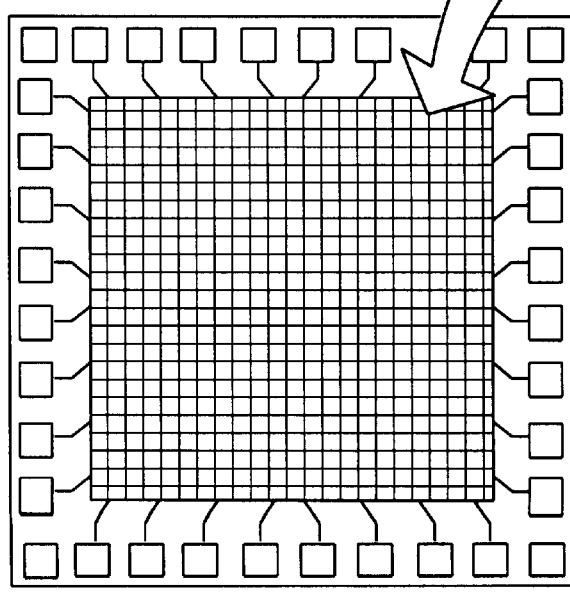
FIG. 1

| LUT I | | |
|---|---|---|
| A | B | C |
| 0 | 0 | 0 |
| 0 | 1 | 0 |
| 1 | 0 | 0 |
| 1 | 1 | 1 |

| LUT II | | |
|---|---|---|
| A | B | C |
| 0 | 0 | 0 |
| 0 | 1 | 0 |
| 1 | 0 | 0 |
| 1 | 1 | 1 |

| LUT III | | |
|---|---|---|
| A | B | C |
| 0 | 0 | 0 |
| 0 | 1 | 0 |
| 1 | 0 | 0 |
| 1 | 1 | 1 |

| LUT IV | | |
|---|---|---|
| A | B | C |
| 0 | 0 | 1 |
| 0 | 1 | 1 |
| 1 | 0 | 1 |
| 1 | 1 | 0 |

| LUT I | | |
|---|---|---|
| A | B | C |
| 0 | 0 | 0 |
| 0 | 1 | 1 |
| 1 | 0 | 1 |
| 1 | 1 | 1 |

| LUT II | | |
|---|---|---|
| A | B | C |
| 0 | 0 | 0 |
| 0 | 1 | 1 |
| 1 | 0 | 1 |
| 1 | 1 | 1 |

| LUT III | | |
|---|---|---|
| A | B | C |
| 0 | 0 | 0 |
| 0 | 1 | 1 |
| 1 | 0 | 1 |
| 1 | 1 | 1 |

| LUT IV | | |
|---|---|---|
| A | B | C |
| 0 | 0 | 1 |
| 0 | 1 | 0 |
| 1 | 0 | 0 |
| 1 | 1 | 0 |

LOOK UP TABLE
2 INPUTS 1 OUTPUT

INTEGRATED CIRCUIT DEVICE

FIELD OF THE INVENTION

The present invention relates to integrated circuit devices as well as to methods for personalizing and programming such devices and resulting integrated circuit devices.

BACKGROUND OF THE INVENTION

Various types of personalizable integrated circuits and programmable integrated circuits are known in the art. Personalizable integrated circuits include gate arrays, such as laser programmable gate arrays, commonly known as LPGA devices, which are described, inter alia in the following U.S. Pat. Nos.: 4,924,287; 4,960,729; 4,933,738; 5,111,273; 5,260,597; 5,329,152; 5,565,758; 5,619,062; 5,679,967; 5,684,412; 5,751,165; 5,818,728. Devices of this type are personalized by etching or laser ablation of metal portions thereof.

There are also known field programmable gate arrays, commonly known as FPGA devices, programmable logic devices, commonly known as PLD devices as well as complex programmable logic devices, commonly known as CPLD devices. Devices of these type are programmable by application of electrical signals thereto.

It has been appreciated in the prior art that due to the relatively high silicon real estate requirements FPGA devices, they are not suitable for many high volume applications. It has therefore been proposed to design functional equivalents to specific programmed FPGA circuits. Such functional equivalents have been implemented in certain cases using conventional gate arrays. The following U.S. Patents show such implementations: U.S. Pat. Nos. 5,068,063; 5,526,278 & 5,550,839.

SUMMARY OF THE INVENTION

The present invention seeks to provide an improved integrated circuit which, contrary to the teachings of the prior art, is both personalizable and programmable.

There is thus provided in accordance with a preferred embodiment of the present invention a personalizable and programmable integrated circuit device including:

at least first and second programmable logic cells; and at least two electrical conductive paths interconnecting the at least first and second programmable logic cells, at least a portion of which can be removed for personalization of the integrated circuit device.

There is additionally provided in accordance with a preferred embodiment of the present invention a personalizable and programmable integrated circuit device including:

at least first and second programmable logic cells; and at least one personalizable electrical conductive path interconnecting the at least first and second programmable logic cells, the conductive path defining a short circuit between outputs of the at least first and second programmable logic cells.

There is further provided in accordance with a preferred embodiment of the present invention a selectably configurable and field programmable integrated circuit device including:

at least first and second field programmable logic cells; and at least two electrical conductive paths interconnecting the at least first and second programmable logic cells, at least a portion of which can be removed for selectable configuration of the integrated circuit devices.

Preferably, the at least first and second programmable logic cells are programmable by the application of an electrical signal thereto.

In accordance with a preferred embodiment of the present invention, functions of the at least first and second programmable logic cells are programmable by the application of an electrical signal thereto and logic functions of the at least first and second programmable logic cells are programmable by the application of an electrical signal thereto.

Preferably at least one of the at least two conductive paths defines a short circuit between outputs of the at least first and second programmable logic cells.

There is also provided in accordance with a preferred embodiment of the present invention a selectably configurable and programmable integrated circuit device including:

at least first and second programmable logic cells; and at least two selectably configurable electrical conductive paths interconnecting the at least first and second programmable logic cells, at least one of which defines a short circuit between outputs of the at least first and second programmable logic cells.

Preferably, the at least first and second programmable logic cells are programmable by the application of an electrical signal thereto.

In accordance with a preferred embodiment of the present invention, functions, preferably comprising logic functions, of the at least first and second programmable logic cells are programmable by the application of an electrical signal thereto.

Preferably, programming of the first and second programmable logic cells may take place following selectable configuration of the device.

There is additionally provided in accordance with a preferred embodiment of the present invention a selectably configurable and programmable integrated circuit device wherein programming of the first and second programmable logic cells may take place following selectable configuration of the device.

In accordance with a preferred embodiment of the present invention the first and second programmable logic cells may be reprogrammed.

There is also provided in accordance with a preferred embodiment of the present invention a method for personalization and programming of an integrated circuit device including:

providing an inoperative integrated circuit device including:

at least first and second programmable logic cells; and at least one electrical conductive path interconnecting the at least first and second programmable logic cells;

removing at least a portion of the electrical conductive path for personalization of the integrated circuit devices.

Preferably, the method also includes the step of programming at least one of the at least first and second programmable logic cells by applying an electrical signal thereto.

In accordance with a preferred embodiment of the present invention, the step of programming includes programming functions, preferably including logic functions, of the at least first and second programmable logic cells by the application of an electrical signal thereto.

Preferably, the step of removing includes eliminating a short circuit between outputs of the at least first and second programmable logic cells by etching at least one conductive layer.

There is also provided in accordance with a preferred embodiment of the present invention a method for personalization and programming of an integrated circuit device including:

providing an inoperative integrated circuit device including:
at least first and second programmable logic cells; and
at least two electrical conductive paths interconnecting the at least first and second programmable logic cells;
removing at least a portion of the at least two electrical conductive paths for eliminating a short circuit between outputs of the at least first and second programmable logic cells.

There is additionally provided in accordance with a preferred embodiment of the present invention a method for selectable configuration and programming of an integrated circuit device including:

providing an inoperative integrated circuit device including:
at least first and second programmable logic cells; and
at least two electrical conductive paths interconnecting the at least first and second programmable logic cells;
removing at least a portion of the at least two electrical conductive paths for selectable configuration of the integrated circuit device.

There is further provided a method for selectable configuration and programming of an integrated circuit device including:

providing an inoperative integrated circuit device including:
at least first and second programmable logic cells; and
at least two electrical conductive paths interconnecting the at least first and second programmable logic cells; and
removing at least a portion of the at least two electrical conductive paths for eliminating a short circuit between outputs of the at least first and second programmable logic cells.

There is additionally provided in accordance with a preferred embodiment of the present invention a personalizable and programmable integrated circuit device including:

at least first and second programmable logic cells which are programmable by application thereto of an electrical signal; and
at least two electrical conductive paths interconnecting the at least first and second programmable logic cells, at least a portion of which can be removed by etching for personalization of the integrated circuit device.

There is further provided in accordance with a preferred embodiment of the present invention a personalized programmable integrated circuit device including:

at least first and second programmable logic cells which are programmable by application thereto of an electrical signal; and
at least two electrical conductive paths interconnecting the at least first and second programmable logic cells, at least a portion of which has been removed by etching during personalization of the integrated circuit device.

It is appreciated that the integrated circuit device may comprise a conventional integrated circuit device having only a portion thereof constructed and operative in accordance with the present invention to be both personalizable and programmable.

BRIEF DESCRIPTION OF THE DRAWINGS

The present invention will be understood and appreciated more fully from the following detailed description, taken in conjunction with the drawings in which:

FIG. 1 is a simplified illustration of a personalizable and programmable integrated circuit device constructed and operative in accordance with a preferred embodiment of the present invention;

DETAILED DESCRIPTION OF A PREFERRED EMBODIMENT

Figure 2:
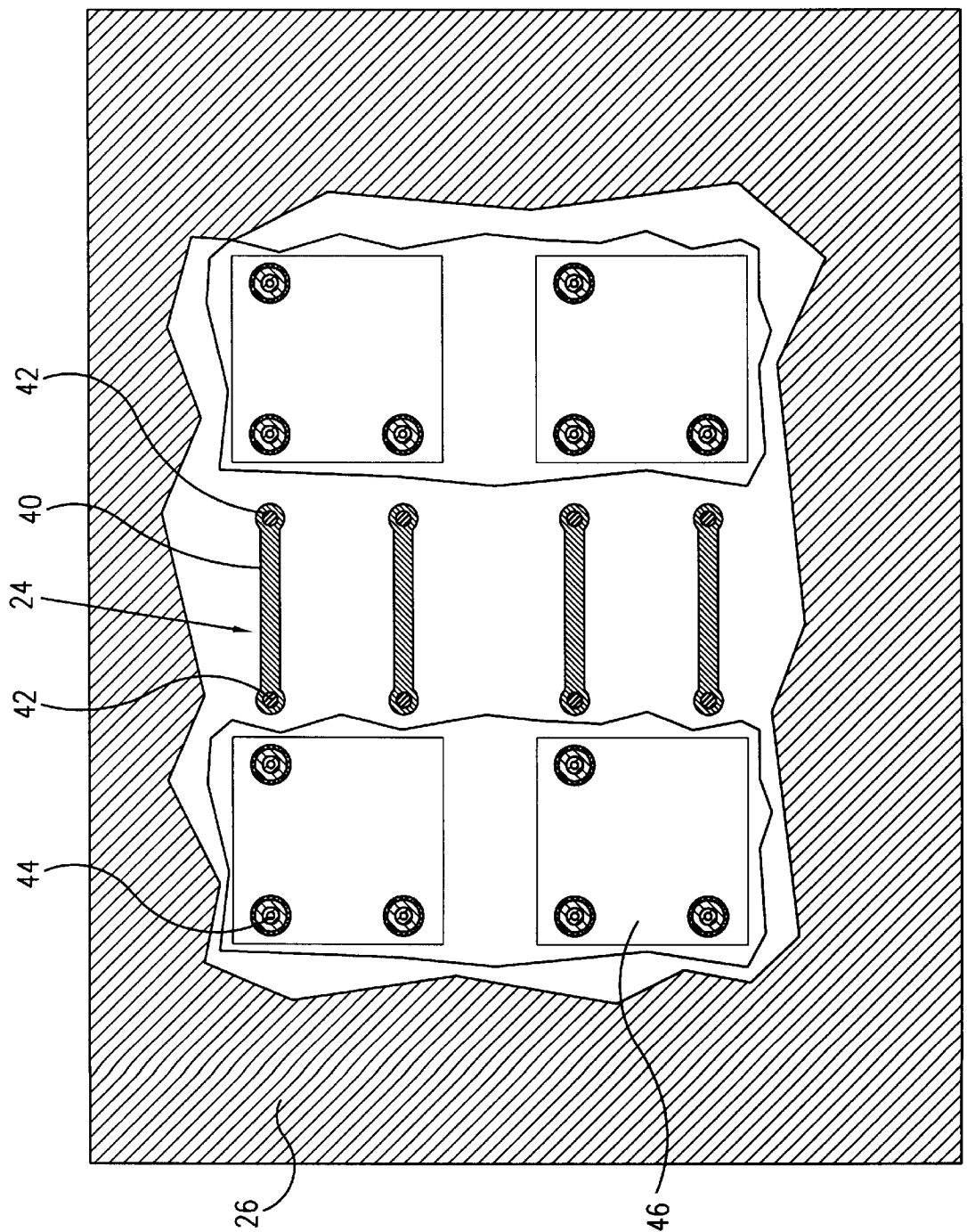
FIG. 2 is a more detailed illustration of a portion of the integrated circuit device of FIG. 1 including both personalizable and programmable portions.

Reference is now made to FIG. 1, which is a simplified illustration of a personalizable and programmable integrated circuit device constructed and operative in accordance with a preferred embodiment of the present invention. The integrated circuit device of FIG. 1 may be a stand-alone device or may alternatively be integrated into a larger device. In such a case, the device may constitute a personalizable and programmable portion of a system on a chip. The present invention relates to both of the above implementations, notwithstanding that the following description, for the sake of simplicity and conciseness, describes only the stand-alone device.

FIG. 1 illustrates a device typically including four metal layers, designated by reference numerals 20, 22, 24 and 26.

Preferably, the top metal layer 26 is a personalizable metal layer and may be a generally unpatterned solid layer of metal which may readily be configured by employing conventional lithography and conventional etching.

Preferably one or more of metal layers 20, 22 and 24 may comprise pre-patterned electrically conductive paths 28, 30 and 32 respectively. The term "electrically conductive path" excludes semiconductor connections and antifuses in series therewith. Preferably all or most of each metal layer 20, 22 and 24 which comprises pre-patterned electrically conductive paths constitutes repeated sub-patterns.

Layer 26 and the conductive paths 32 on layer 24 together provide personalizable portions of the integrated circuit device, while conductive paths 30 and 32 on respective layers 20 and 22 cooperate with transistors in silicon layers adjacent thereto to provide programmable portions of the integrated circuit device.

Reference is now made to FIG. 2, which is a more detailed illustration of portions of the integrated circuit device of FIG. 1 including both personalizable and programmable portions. FIG. 2 shows unpatterned layer 26 and thereunder patterned layer 24. On layer 24 there are shown a plurality of bridges 40 communicating between adjacent vias 42, which in turn are coupled to layer 26.

Layer 24 also includes sections of vias 44 which communicate between layers 20 and 22 and layer 26. Vias 44 interconnected various electrically programmable logic units, which are designated schematically as blocks 46 and are typically located on and adjacent layers 20 and 22 and their adjacent silicon layers.

Electrically programmable logic units 46 typically comprise conventional field programmable logic units, such as FPGAs, which may include, for example, RAMs, Flash Memories, PROMs and antifuse links.

Figure 9:
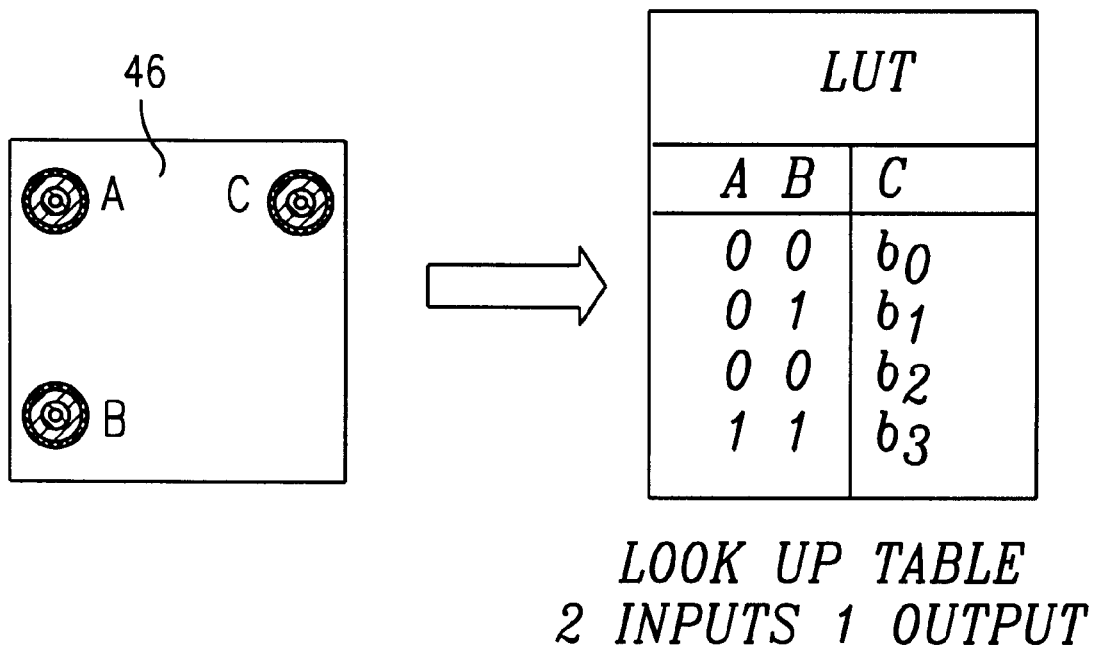
FIG. 9 is a Look Up Table illustrating part of the functionality of the circuitry of FIGS. 2–4.

FIG. 9 is a simplified table indicating part of the functionality of a typical logic unit 46, such as a RAM, having address inputs A and B connected to layer 26 by respective vias 44 which are labeled A and B and an output C, also connected to layer 26 by a via 44, which is labeled C.

It may be seen from FIG. 9 that output C has a different value b0, b1, b2 and b3 for each of four different combinations of inputs A and B. The logic unit 46 may thus be programmed by suitable selection of the values b0, b1, b2 and b3 output in response to the various input combinations provided to inputs A and B.

Figure 3:
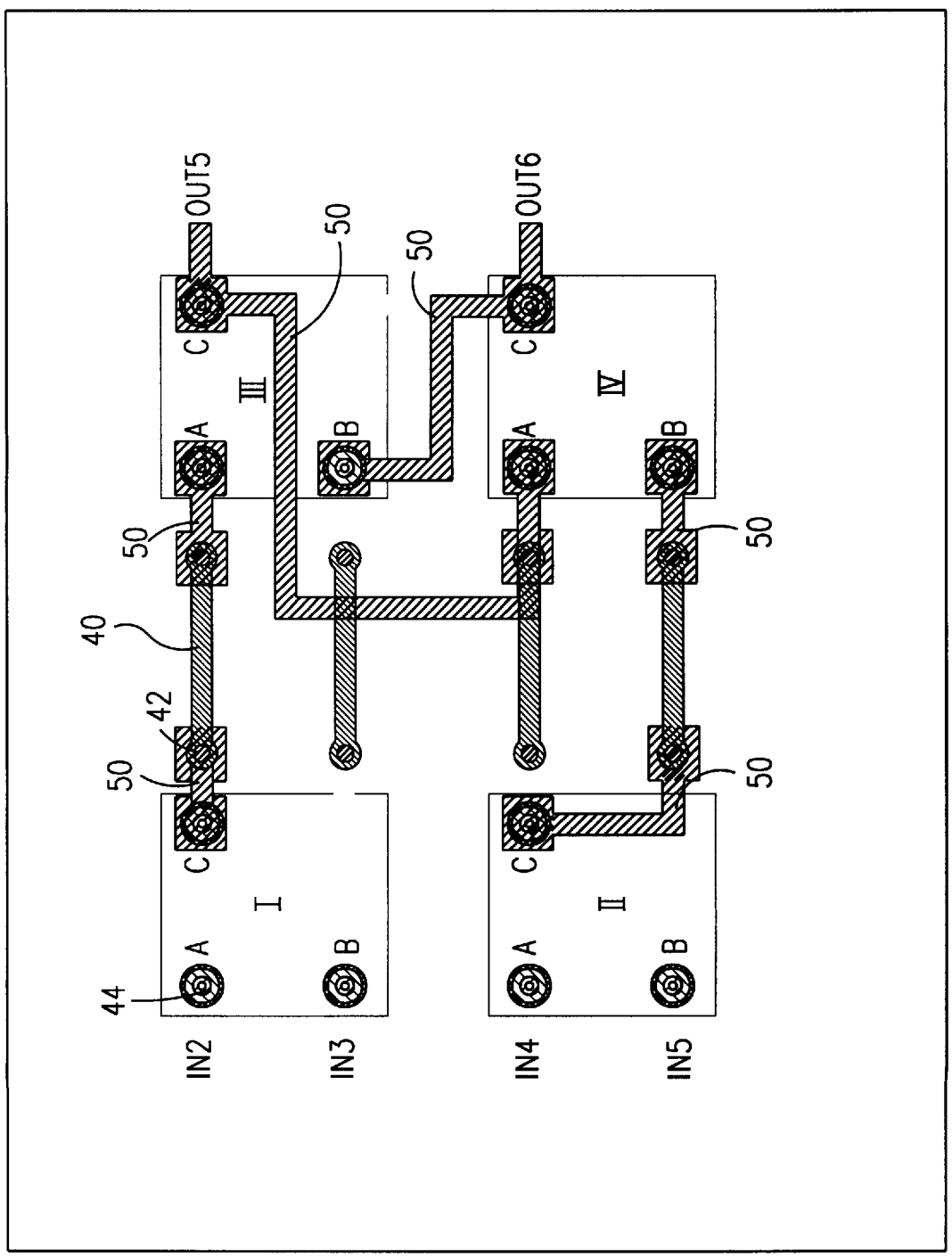
FIG. 3 is an illustration of the circuitry of FIG. 2 following personalization for one type of functionality.
Figure 4:
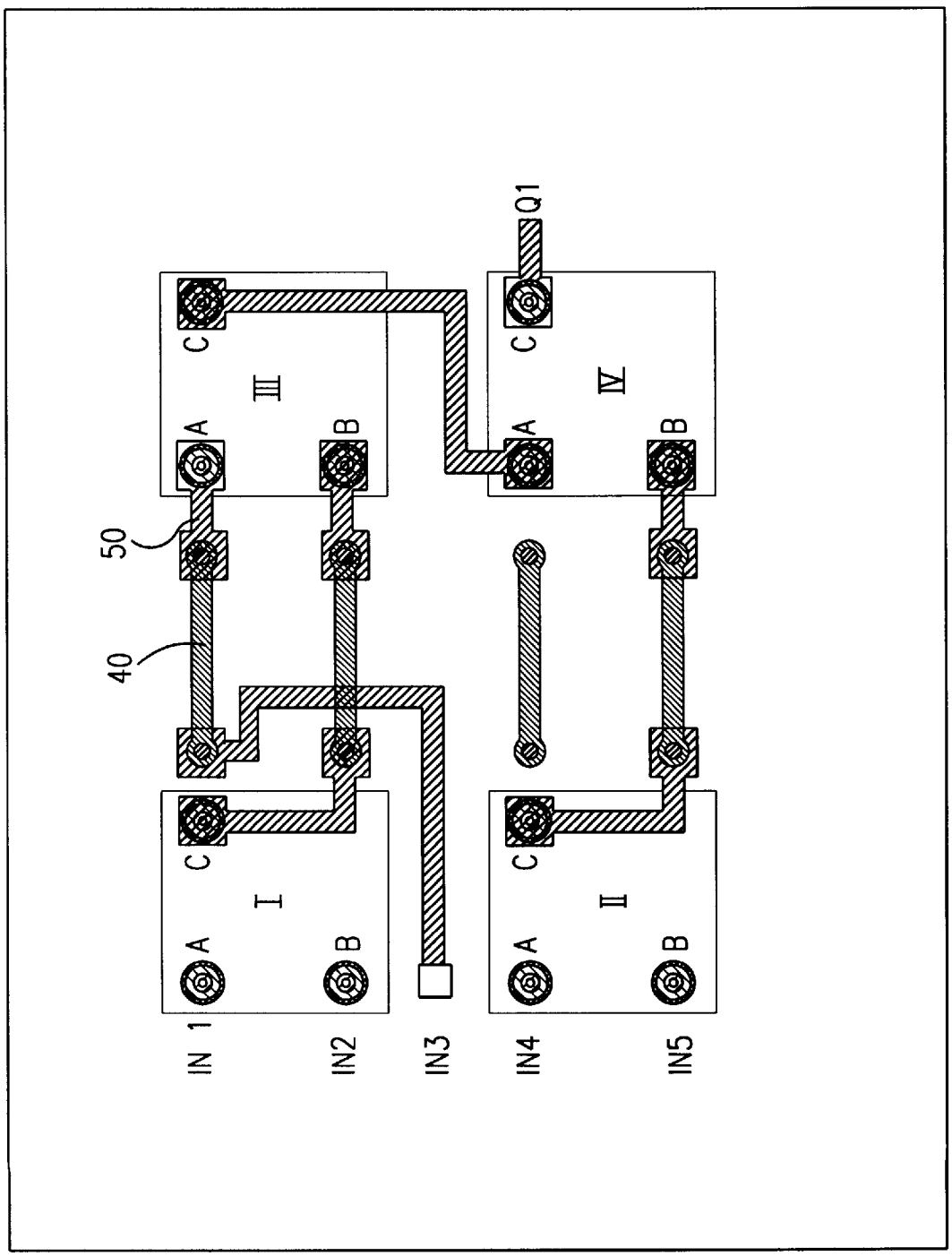
FIG. 4 is an illustration of the circuitry of FIG. 2 following personalization for another type of functionality.

Reference is now made to FIG. 3, which is an illustration of the circuitry of FIG. 2 following personalization for one type of functionality. It is seen that most of layer 26 has been removed, leaving only electrically conductive pathways 50, which interconnect various vias 42 and 44. FIG. 4, which is an illustration of the circuitry of FIG. 2 following personalization for another type of functionality shows a different pattern of conductive pathways 50.

Figure 5:
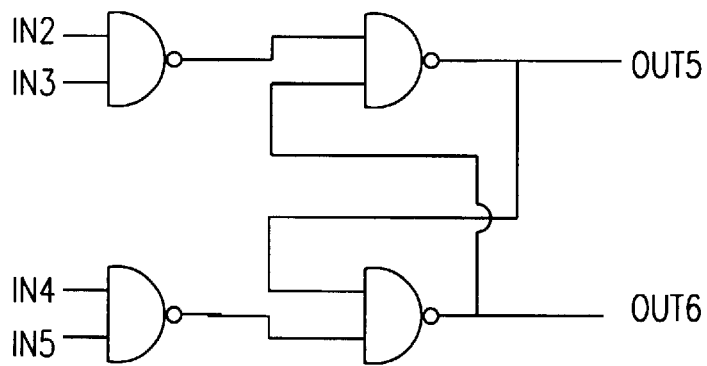
FIG. 5 is an equivalent circuit illustrating the circuitry of FIG. 3 following personalization and programming for one type of functionality.
Figure 6:
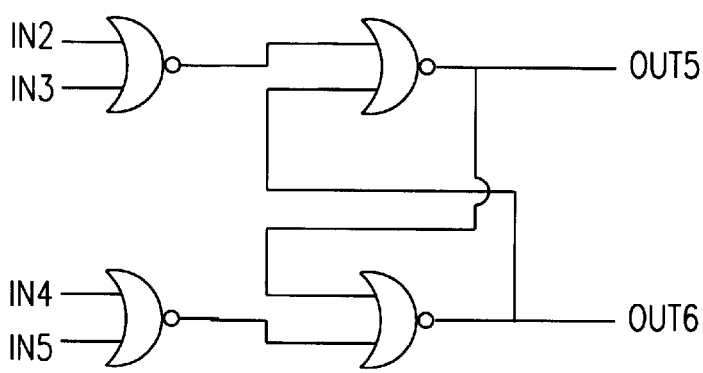
FIG. 6 is an equivalent circuit illustrating the circuitry of FIG. 3 following personalization and programming for another type of functionality.

Reference is now made to FIG. 5, which is an equivalent circuit illustrating the circuitry of FIG. 3 following personalization and programming for one type of functionality. FIG. 5 shows the logic function produced by the circuitry of FIG. 3 when all of the logic units 46 thereof are programmed identically in accordance with the look-up table shown therein. FIG. 6 shows that when all the logic units 46 thereof are programmed in accordance with the look-up table shown therein, different from look-up table of FIG. 5, a different logic function results.

Figure 7:
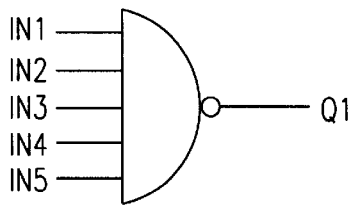
FIG. 7 is an equivalent circuit illustrating the circuitry of FIG. 4 following personalization and programming for one type of functionality.

Reference is now made to FIG. 7, which is an equivalent circuit illustrating the circuitry of FIG. 4 following personalization and programming for one type of functionality. FIG. 7 shows the logic function produced by the circuitry of FIG. 4 when the various logic units are programmed in accordance with the look-up tables shown therein.

Figure 8:
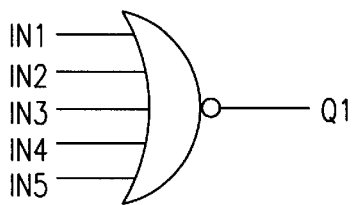
FIG. 8 is an equivalent circuit illustrating the circuitry of FIG. 4 following personalization and programming for another type of functionality.

FIG. 8 shows that when the various logic units of FIG. 4 is programmed in accordance with the look-up tables shown therein differently from the look-up tables of FIG. 7, a different logic function results.

What is claimed is:

1. A personalizable and programmable integrated circuit comprising:

at least first and second programmable logic cells each having at least one input and at least one output; and at least one permanent interconnection path directly interconnecting at least one output of at least one of said first and second programmable logic cells with at least one input of at least one of said first and second programmable logic cells.

2. A personalizable and programmable integrated circuit device according to claim 1 and wherein said at least first and second programmable logic cells are programmable by the application of an electrical signal thereto.

3. A personalizable and programmable integrated circuit device according to claim 2 and wherein logic functions of said at least first and second programmable logic cells are programmable by the application of an electrical signal thereto.

4. A personalizable and programmable integrated circuit device according to claim 1 and wherein said at least one interconnection path defines a short circuit between outputs of said at least first and second programmable logic cells.

5. A personalizable and programmable integrated circuit device according to claim 1 and wherein said integrated circuit device comprises a stand-alone device.

6. A personalizable and programmable integrated circuit device according to claim 1 and wherein said integrated circuit device is integrated into a larger device.

7. A personalizable and programmable integrated circuit device according to claim 1 and wherein at least a majority of said at least one interconnection path constitutes repeated subpatterns.

8. A personalizable and programnmable integrated circuit according to claim 1 and wherein said at least one permanent interconnection path at least partially overlies said at least one of said first and second programmable logic cells.

9. A customizable logic array device comprising:

an array of programmable cells having a multiplicity of inputs and a multiplicity of outputs; and customized interconnections permanently directly interconnecting at least a plurality of said multiplicity of inputs and at least a plurality of said multiplicity of outputs.

10. A customizable logic array device according to claim 9 and wherein said at least one permanent interconnection path at least partially overlies said array of programmaable cells.

* * * * *